(12) United States Patent
Chandran et al.

(10) Patent No.: US 6,750,549 B1
(45) Date of Patent: Jun. 15, 2004

(54) VARIABLE PAD DIAMETER ON THE LAND SIDE FOR IMPROVING THE CO-PLANARITY OF BALL GRID ARRAY PACKAGES

(75) Inventors: Biju I. Chandran, Chandler, AZ (US); Carlos A. Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,202

(22) Filed: Dec. 31, 2002

(51) Int. Cl.[7] .................. H01L 23/48; H01L 23/52; H01L 29/40
(52) U.S. Cl. .............. 257/780; 257/781; 257/778; 438/613
(58) Field of Search .................. 257/780, 781, 257/778, 737, 692, 786; 438/613, 108

(56) References Cited

U.S. PATENT DOCUMENTS 6,184,586 B1 * 2/2001 Matsushima
6,222,277 B1 * 4/2001 Downes
6,225,699 B1 * 5/2001 Ference et al.
6,238,949 B1 * 5/2001 Nguyen et al.
6,252,298 B1 * 6/2001 Lee et al.

* cited by examiner

*Primary Examiner*—S. V. Clark
(74) *Attorney, Agent, or Firm*—Schwegman, Lundberg, Woessner & Kluth, P.A.

(57) ABSTRACT

A ball grid array device includes a substrate and a die attached to the substrate. The substrate further includes a first major surface and a second major surface. A first ball, having an attached end and a distal tip end, is attached to a major surface of the substrate. The first ball has a first height. A second ball, having an attached end and a distal tip end, is also attached to the major surface. The second ball has a second height different from the first height. The first height and the second height are selected to produce a substantially co-planar surface at the distal tip ends of the first ball and the second ball. The major surface is not substantially co-planar. A method for forming the balls of a ball grid array device on a major of a substrate includes determining height differences across the major surface of the substrate, placing lands on the substrate, and forming a plurality of balls on the lands. Each of the balls has an attached portion and a tip portion. The balls are formed with varying heights so the tip portions of each of the plurality of balls define a substantially planar surface.

30 Claims, 5 Drawing Sheets

VARIABLE PAD DIAMETER ON THE LAND SIDE FOR IMPROVING THE CO-PLANARITY OF BALL GRID ARRAY PACKAGES

FIELD OF THE INVENTION

The present invention is related to ball grid array packages. More specifically, the present invention relates to methods and apparatus for forming a more co-planar structure for ball grid array packages.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices has been the demand for increased numbers of external electrical connections to be present on the exterior of the die and on the exterior of the semiconductor packages that receive the die, for connecting the packaged device to external systems, such as a printed circuit board.

In the past, the die and package were first attached and then were wire bonded. In a wired bonded die and package, a thin (0.7 to 1.0 mil) wire is bonded to the chip bonding pad, and spanned to the inner lead of the package lead frame. Next, the wire is bonded to the inner lead. Lastly, the wire is clipped and the entire process repeated at the next bonding pad. Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds, and must be placed one-by-one, and there are resistances associated with each bond. The wires are also relatively long.

To increase the number of pad sites available for a die and to overcome other problems, dies were provided with deposited metal bumps on each bonding pad. The bonding pads were also moved to the side of the die nearest the transistors and other circuit devices formed in the die. As a result, the electrical path to the pad is shorter. Connection to the package is made when the chip is flipped over and soldered. As a result, the dies are commonly called flip chips in the industry. Each bump connects to a corresponding package inner lead. The packages which result are lower profile and have lower electrical resistance and a shortened electrical path. The plurality of ball-shaped conductive bump contacts (usually solder, or other similar conductive material) are typically disposed in a rectangular array. The packages are occasionally referred to as "Ball Grid Array" (BGA) or "Area Grid Array" packages, or Chip Size Packages (CSPs).

A typical BGA package is characterized by a large number of solder balls disposed in an array on a surface of the package. It is not uncommon to have hundreds of solder balls in an array. The BGA package is assembled to a matching array of conductive pads. The pads are connected to other devices within a substrate or circuitry on a circuit board. Heat is applied to reflow the solder balls (bumps) on the package, thereby wetting the pads on the substrates and, once cooled, forming electrical connections between the package and the semiconductor device contained in the package and the substrate.

The introduction of flip chips and Ball Grid Array (BGA) packages to the semiconductor industry have brought several new manufacturing and assembly challenges. One of the more significant challenges is keeping the height of solder ball contacts substantially uniform or substantially co-planar. This is a critical factor for successful attachment of BGA-type packages to mother boards. If one or more balls are significantly shorter than others, it becomes highly likely that these smaller (shorter) contacts will completely miss their mating contact pads and will fail to form an electrical connection between the semiconductor package and the mother board. Manufacturers must meet standard specifications regarding co-planarity. One common standard is JEDEC, which sets the maximum acceptable ball co-planarity for any size package to be 8 mils. The maximum height difference between the balls in the array is known as the co-planarity of the substrate.

Another challenge is to control the volume of solder associated with each pad. If one pad is provided with too much solder, it may contact a neighboring pad on the land side of the package, causing an unwanted contact or short in the package.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Figure 1:
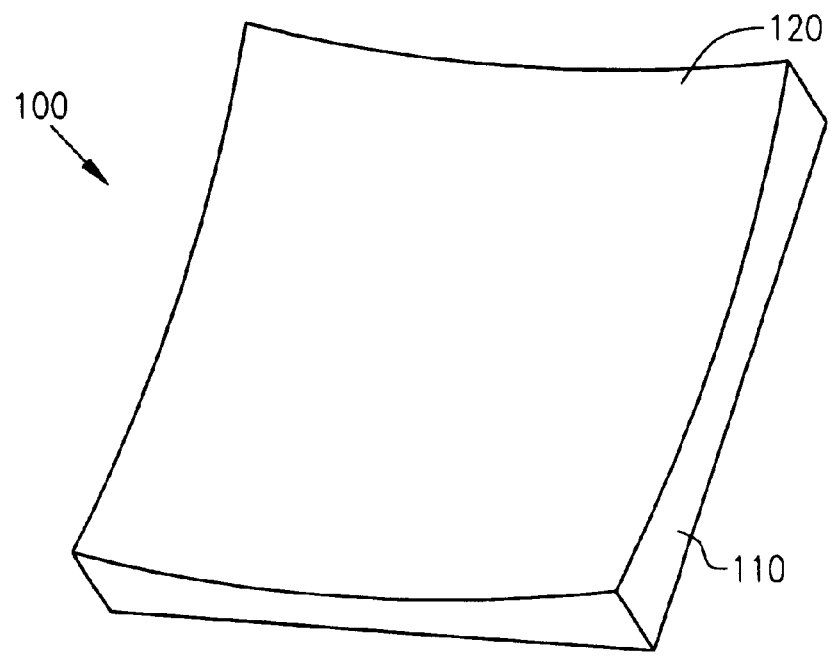
FIG. 1 illustrates a perspective view of the land side of a substrate showing warpage of the land side of the package resulting from attaching the die to the package, according to an embodiment of this invention.

FIG. 1 is a perspective view of a substrate 100. The substrate 100 includes a first major surface 110 and a second major surface 120. The substrate 100 is used to form a package that includes a die (shown in FIG. 3) that further includes many components of an electronic circuit device. The die is not shown in FIG. 1. The die is typically made out of a semiconductive material that has a different coefficient of thermal expansion (CTE) when compared to the material that comprises the substrate 100. The coefficient of thermal expansion between the silicon die and the substrate 100 induces warping in the substrate 100 after the die is attached. The die is attached to a major surface such as major surface 110 of the substrate 100. Lands are placed on the other major surface, such as major surface 120, on the substrate or package 100. Solder balls are then placed upon the lands on the major surface, such as 120. As mentioned in the background of the invention, it is very important to have ball co-planarity. Ball co-planarity can be defined as peak-to-valley height differences between the tips of the various balls attached to the lands. FIG. 1 merely shows the warpage of the major surface 120 of the substrate 100. The balls and lands are not shown in FIG. 1 for the sake of clarity.

Figure 2:
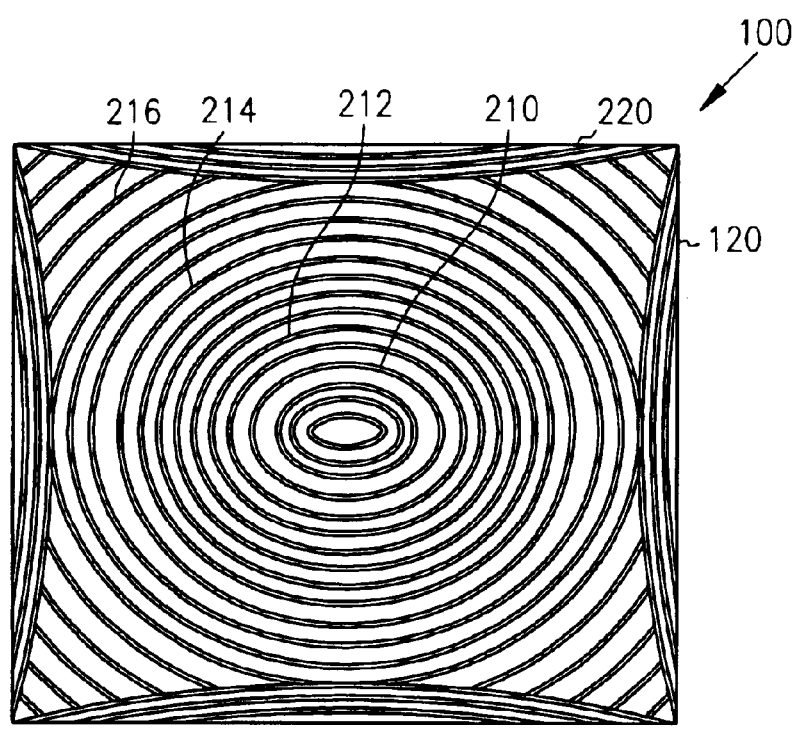
FIG. 2 illustrates a top view of the land side of a substrate showing warpage of the land side of the package using contour lines on the land side of the package.

FIG. 2 illustrates a top view of the landside major surface 120 of a substrate 100. In other words, FIG. 2 is another illustration of the warpage that is induced by the CTE mismatch between the silicon die and the substrate 100. The dark lines, which appear as rings around the point 0 in FIG. 2, are actually contour lines like the lines of a contour map, which show or depict lines of equal elevation. As can be seen from FIG. 2, there are many contour lines, such as contour line 210, 212, 214, and 216. The major surface 120 is somewhat cup-shaped, with a deep center. Thus, the lines around the centerpoint 0, such as contour line 210, show the deepest portion of the cup; as the rings radiate outwardly from contour line 210–216, the height difference, or the equal elevation, becomes shallower near an edge 220 of the major surface 120. Of course, warpage is one shape difference where the major surface 120 of the substrate 100 is irregular or nonplanar. There may be other instances of shapes where the substrate 120 is not planar, which are due to conditions other than a CTE-induced warpage of substrate 100. There also may be instances where a CTE-induced warpage produces different shapes than the one shown and discussed with respect to FIGS. 1 and 2.

Figure 3:
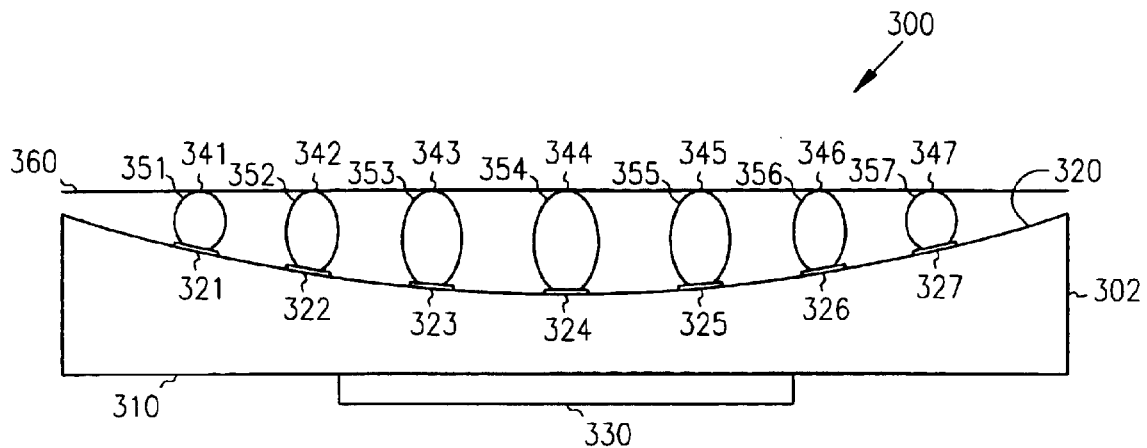
FIG. 3 illustrates a cross-sectional view of a die attached to a package having a ball grid array according to one embodiment of this invention.

FIG. 3 illustrates a cross-sectional view of a die 330 attached to a package 300, which has a ball grid array 340 attached to a major surface 320 of the package 300. The package 300 includes a substrate 302 having a first major surface 310 and a second major surface 320. The silicon die 330 is attached to the package 300 on major surface 310. A CTE-induced warpage or other deformation produces or causes the major surface 320 to be nonplanar. As shown in FIG. 3, major surface 320 is nonplanar. It should be noted that the warping shown in the drawing is exaggerated to illustrate the invention. In other words, the major surface 320 of the package 300 will generally appear to be more like a plane in most instances. A plurality of balls 341, 342, 343, 344, 345, 346, 347 are attached to the major surface 320. The major surface 320 includes a plurality of lands such as 321, 322, 323, 324, 325, 326, and 327. The balls 341, 342, 343, 344, 345, 346, 347 are attached to the lands 321, 322, 323, 324, 325, 326, 327 at their attachment end. Each of the balls has a tip 351, 352, 353, 354, 355, 356, 357 which terminates away from or distant from the attached end at the lands 321, 322, 323, 324, 325, 326, 327. As shown in FIG. 3, the tips terminate at a plane defined by a dotted line carrying the reference numeral 360. Thus, the geometry of the balls 341, 342, 343, 344, 345, 346, 347 are changed or formed so that the tips 351, 352, 353, 354, 355, 356, 357 all occur along a plane depicted by line 360. In short, the height of the balls 341, 342, 343, 344, 345, 346, 347 is varied so that the tips 351, 352, 353, 354, 355, 356, 357 all occur along a plane depicted by line 360. The ball 344 at the center of the major surface 320 has a height that is larger than the ball 341 at the edge of the major surface 320. There are several ways to vary the geometry of the balls 341, 342, 343, 344, 345, 346, 347. One way to vary the geometry of the balls is to vary the volume of the ball. In another embodiment, the volume of the balls remains substantially equal and another aspect of the geometry is varied to vary the height of the balls.

Figure 4A:
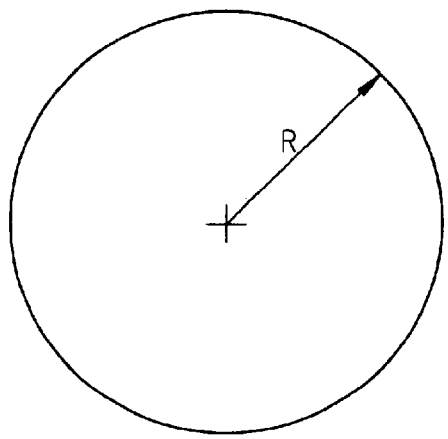
FIG. 4A illustrates a BGA ball.
Figure 4B:
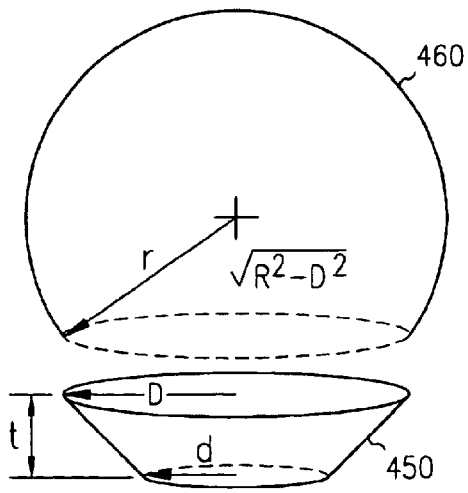
FIG. 4B illustrates a BGA ball after attachment to a land.
Figure 4C:
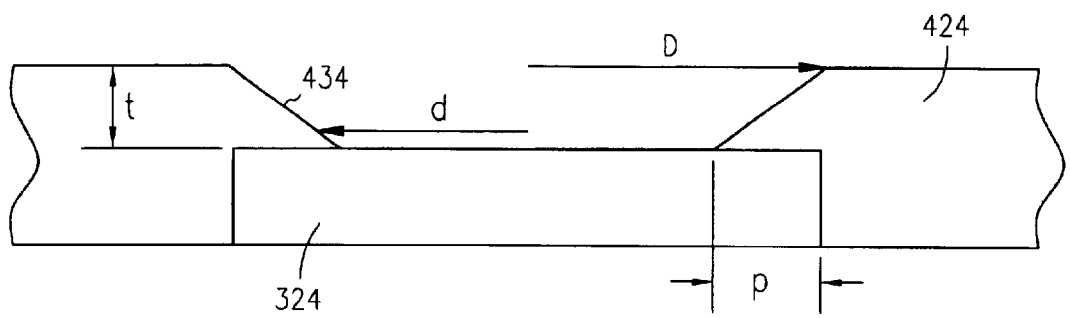
FIG. 4C illustrates a land with a solder mask in place to which the BGA ball of FIG. 4B is attached.

FIG. 4A illustrates a BGA ball having a radius R. FIG. 4B illustrates a BGA ball as attached through a solder mask to a land. FIG. 4C illustrates a land 324 that is partially covered by a portion of a solder mask 424. The land 324 will generally have a radius D. The solder mask 424 generally will cover a portion of the land 324. An opening 434 in the solder mask 424 will generally be circular and have a radius of d. Therefore, the portion of the solder mask between the land 324 and the top of the solder mask 424 is generally frusto-conically shaped. The difference between the smaller diameter, d, and the larger diameter, D, of the solder mask 424 is depicted by the dimension p. The dimension p can also be thought of as the length of the land 324 which is covered by the solder mask 424. The height of the solder mask 424 above the land 324 has a dimension t. The dimension t is also the height of the frusto-conical cone formed by the opening 434 in the solder mask 424.

Turning once again to FIG. 4B, the solder when attached to the land has a ball-shaped portion with a radius r. As shown on FIG. 4B, the shape of the solder ball as attached is a frusto-conical cone, depicted by reference numeral 450, and a partial ball, depicted by reference numeral 460, which sits atop the frusto-conical portion 450. The frusto-conical cone portion 450 corresponds to the shape of the opening 434 in the solder mask 424. The height of the ball sitting atop the frusto-conical cone will be $r+\sqrt{r^2-D^2}$. As shown in FIG. 4B, the ball portion 460 has a radius r. The height of the ball above or below the radius r can be determined using the Pythagorean theorem. In other words, the square of the shorter sides of a right triangle are equal to the square of the hypotenuse. Applying this principle, it can be seen that the length of the side of the shorter side of the ball is equal to $\sqrt{r^2-D^2}$.

It should be noted that volume of the ball shown in FIG. 4A will be the same as the volume of the ball or the geometric shape after being attached, as shown in FIG. 4B. It should be noted that the volume of the solder before and after the ball are attached are the same. As a result, the volume of the ball shown in FIG. 4A is the same as the volume of the ball shown in FIG. 4B. Since this is true, the following equation also holds true $$\frac{4}{3}\pi R^3 = \frac{2}{3}\pi r^3 + \frac{2}{3}\pi r^2 \sqrt{(r^2-D^2)} + \frac{1}{3}\pi D^2 \sqrt{(r^2-D^2)} + \pi t D^2 + \frac{1}{3}\pi t^3 - \pi t^2 D$$

where
R=Radius of the BGA ball before attach
r=Radius pf the BGA ball after attach
p=width of the uncovered portion of the land D=Diameter of the opening in the solder mask at plane most distant from the land This cubic equation can be solved for the real root of r and the height of the solder ball above the solder mask surface can be obtained. Typical values of known variables in this equation are shown in the following table:

| Pitch (mm) | 2d ($\mu$m) | t ($\mu$m) | 2R (mils) | P ($\mu$m) |
|---|---|---|---|---|
| 1.27 | 650 | 20 | 30 | 70 |
| 1 | 470 | 20 | 24 | |

Using the values for a 1.27 mm pitch BGA array, the relationship between the pad opening (2d) and the ball height above the solder mask surface can be obtained from equation (1).

Figure 5:
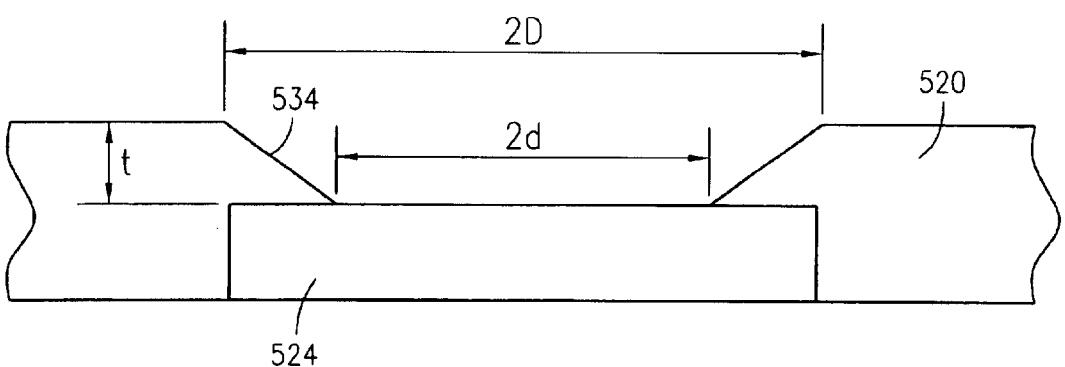
FIG. 5 is a schematic illustration showing that the size of the opening in the solder mask is varied to vary the height of the ball tip.

FIG. 5 is a schematic illustration showing that the size of the opening 534 in the portion of the solder mask 520 associated with a particular land is varied to vary the height of the ball tip. By varying the diameter d and the diameter D in the solder mask portion 520, the height of the tip from the attachment point of a ball can be varied. In one embodiment of the invention, the diameters d, D associated with the opening 534 in the portion of the solder mask 520 is varied so that the tip height of the ball attaching to the land 524 is co-planar with the other ball tips of an array in a ball grid array device. In other words, by varying the geometry of the opening 534 in the solder mask 520, the ball tip height can also be varied. It should be noted that varying the opening size and the thickness of the solder mask portion 520 can also vary the dimension t.

Figure 6:
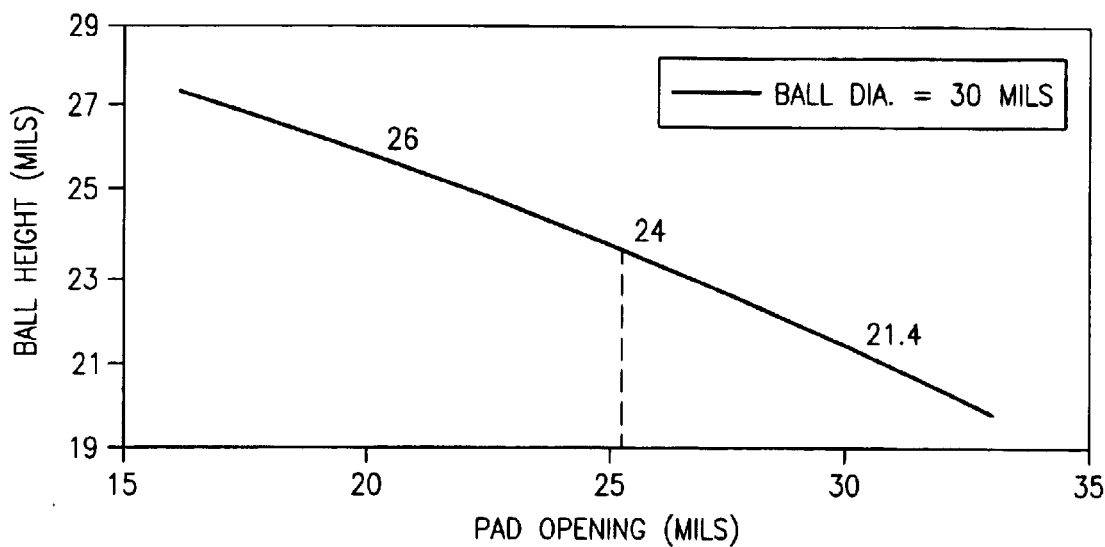
FIG. 6 illustrates the relationship between the size of the pad opening in a solder mask and the ball tip height.

FIG. 6 illustrates the relationship between the size of the pad opening in a solder mask and the ball tip height. FIG. 6 uses the value for the 1.27 mm pitch ball grid array and shows the relationship between the pad opening (2d) and the height of the ball above the surface of the solder mask 520. FIG. 6 plots the pad opening size in mils against the ball height or ball tip height in mils. It can be seen that for smaller pad opening sizes the ball height is larger than for larger pad opening sizes. For example, pad opening size of approximately 20 mils yields a ball height of approximately 26 mils, while a pad opening of approximately 25.6 mils yields a ball height of around 24.7 mils. By making the size of the opening smaller, the ball tip height or ball height can be made higher. Similarly, the tip height of a ball is smaller with larger pad opening sizes.

Figure 7:
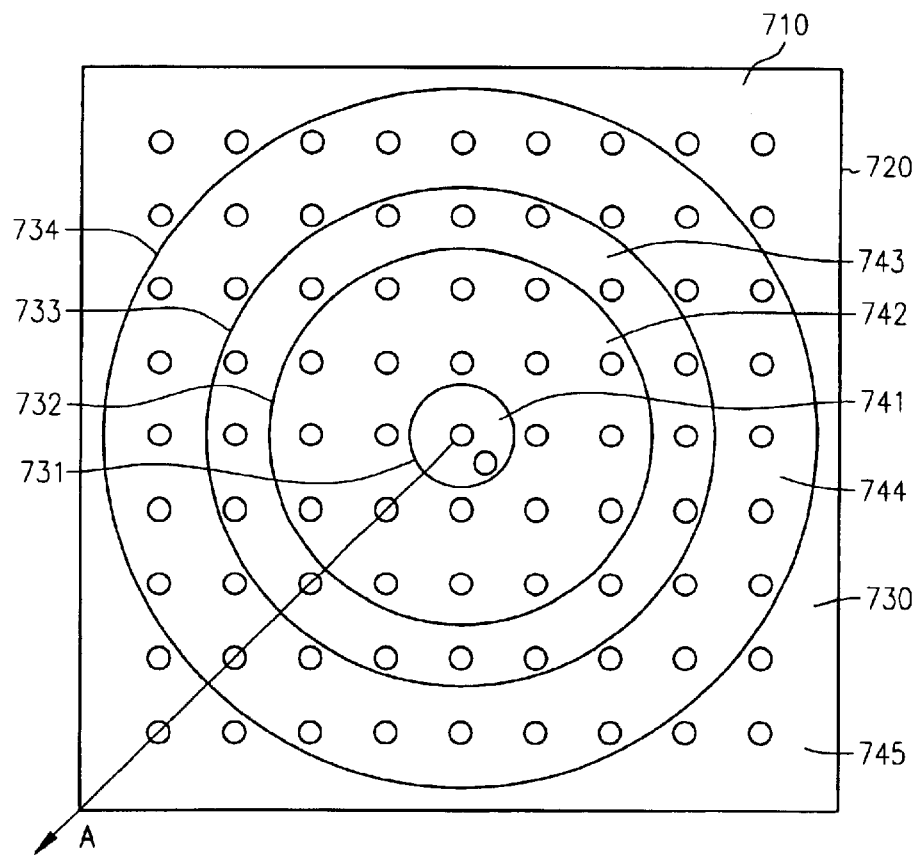
FIG. 7 illustrates a major surface having lands thereon masked according to an embodiment of this invention.

FIG. 7 illustrates a major surface 710 of a substrate 720 that has a solder mask 730 thereon. The solder mask 730 can be divided into zones, which are denoted by areas between the large circles shown on the solder mask 730. The large circles shown in FIG. 7 do not exist on the actual solder mask but are placed on FIG. 7 to illustrate the zones. Large circles carry the reference numerals 731, 732, 733, and 734. Zone 741 is surrounded by circle 731. When the substrate surface 710 is warped due to a coefficient of thermal expansion mismatch between the substrate and the die, the size of the openings within the mask 730 are varied to produce different ball heights. Zone 741 will have the smallest openings, since the ball height of the opening within zone 741 has to be the highest in order to have a ball tip which is co-planar with the other ball tips when the major surface of the substrate is warped. Zone 742 is defined as the openings between the circle 731 and the circle 732. The openings in zone 742 are slightly larger than the solder mask openings in zone 741, thereby producing ball tip heights which are shorter, but which also are substantially co-planar with the ball tip or ball tips of the balls in zone 741.

Similarly, zone 743 is the region that is bound by circle 732 and 733. The openings in the solder mask have a diameter that is slightly larger than the openings in the solder mask associated with zone 742 and 741. The result is that the ball tip heights of the solder ball in zone 743 are slightly lower or slightly less than the ball tip heights in zones 741 and 742. However, because of the warped major surface 710 of the substrate 720, the ball tip heights in all the zones will be substantially co-planar. Zone 744 is defined as the openings in the solder mask 730 that occur between the circle 733 and the circle 734. Again, these solder mask openings will be slightly larger than the solder mask openings in zones 743, 742, and 741. Finally, zone 745 includes the openings in the solder mask 730 which are outside or beyond the circle 734. These solder mask openings will be slightly larger than all the solder mask openings in the other zones, so that the ball heights will be less than the ball heights in the other zones, but will have the tips in a plane as shown in FIG. 3.

In other words, by varying the size of the openings in the solder mask 730, the ball tip heights can be made co-planar or substantially co-planar despite the fact that the major surface 720 is warped. It should be noted that the size of the opening in a solder mask 730 is varied in a radial sense. A radial line OA has been placed on FIG. 7 to show that the opening depicted by reference letter O in the middle of the solder mask 730, which is also in the middle of the major surface 720 of the substrate 710, is the smallest opening, and that it varies radially on the radial OA. Point A is at one of the corners of the major surface 710 of the substrate 720.

It should be noted, however, that the invention describes a solution for a warped major surface 710 of a substrate 720. This is merely one example of a nonplanar surface. This particular invention could be used to cover different shapes of nonplanar surfaces, including the shape of the warped surface as described herein. It should be noted that a warped surface can be estimated or predicted for a particular geometry of a substrate.

Figure 8:
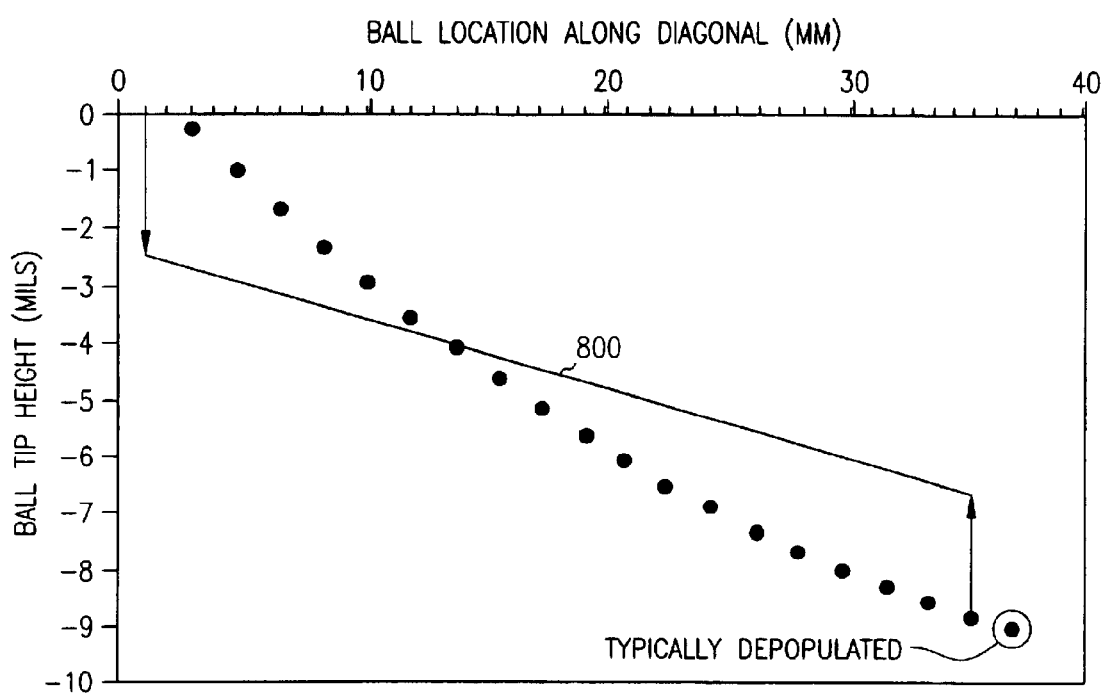
FIG. 8 illustrates the ball tip height when all the balls are uniformly formed and the ball tip height when the size of the attachment opening is changed to change the height of the ball.

FIG. 8 illustrates the ball tip height when all the balls are uniformly formed, versus the ball tip heights when the size of the attachment opening is changed or varied to change the height of the ball. The solid line carrying the reference numeral 800 illustrates the variation in ball tip height resulting from changing the size of the attachment opening through the solder mask on a major surface of a substrate. The dotted line shows the ball tip height if all the balls are uniformly formed with uniform openings in the solder mask. The difference in ball tip height as shown by the solid line 800 is between 2.5 and approximately 6.5 mils. Therefore, there is a difference in the ball tip height of approximately 4 mils. The result is that it is substantially co-planar, since the standards used to describe or define co-planarity require that the ball tip heights be within 8 mils of one another. It should also be noted that the ball tip heights as depicted by the dotted line vary from 0 to approximately 9 mils, and therefore the ball tip heights using uniform balls would not be substantially co-planar.

A ball grid array device includes a substrate and a die attached to the substrate. The substrate further includes a first major surface and a second major surface. A first ball, having an attached end and a distal tip end, is attached to a major surface of the substrate. The first ball has a first height. A second ball, having an attached end and a distal tip end, is also attached to the major surface. The second ball has a second height different from the first height. The first height and the second height are selected to produce a substantially co-planar surface at the distal tip ends of the first ball and the second ball. The major surface is not substantially co-planar. The ball grid array device includes a plurality of balls attached to a major surface of the substrate. The height of the balls of the ball grid array package are varied to define a plane at the distal tip ends of the plurality of balls. The tip ends of all the balls include the tips of the first ball and the second ball.

A method for forming the balls of a ball grid array device on a major surface of a substrate includes determining height differences across the major surface of the substrate, placing lands on the substrate, and forming a plurality of balls on the lands. Each of the balls has an attached portion and a tip portion. The balls are formed with varying heights so the tip portions of each of the plurality of balls define a substantially planar surface. The height differences across the major surface of the substrate can be measured or predicted. In some embodiments, a topographical map of the major surface can be used to predict the height differences. Forming the plurality of balls on the lands with varying heights includes placing a solder mask over the lands. The solder mask has openings therein of various diameters. The openings in the solder mask are substantially circular. The size of the openings in the solder mask are varied in order to vary the heights of the solder balls attached to the lands. In one embodiment of the invention, each of the plurality of balls has substantially the same volume of material. In another embodiment of the invention, at least some of the plurality of balls have a different volume of solder material than at least some of the other of the plurality of balls. In short, forming a plurality of balls on the lands includes controlling the amount of surface area to which the solder material can attach. In one embodiment of the invention, controlling the amount of surface area to which the solder material can attach includes placing a solder mask over the major surface of the substrate, and varying the size of the openings in the solder mask over the lands.

A method for forming a ball grid array device includes attaching a die to a first major surface of a substrate, forming a plurality of lands on a second major surface of the substrate, determining an amount of warpage on the second major surface of the substrate, and attaching a plurality of balls to the lands on the second major surface of the substrate. The plurality of balls have different heights from the lands to which the balls are attached, to accommodate the warpage on the second major surface of the substrate. The tips of the balls terminate on a substantially planar surface. In one embodiment, the volume of material forming the plurality of balls attached to the lands is substantially equal for each of the plurality of balls. The mask has openings therein which correspond to the lands. The smaller openings form balls having a greater height and than the balls formed on the larger openings in the solder mask. The openings in the solder are substantially circular or substantially frusto-conically shaped. In some embodiments, balls of varying height are formed by varying the volume of at least some of the balls. Attaching the plurality of balls to the lands on the major surface of the substrate includes determining the location of the land and the height of the ball to be attached to the land, so that the tip of the ball is substantially co-planar with the other of the plurality of balls. The size of the openings in the mask restrict the amount of area of the land to which the ball attaches. The size of the openings is related to the height of the balls.

The method and structures shown and described in the above figures and the written description provides many advantages. Using the inventive method and structure results in the balls of a ball grid array type device being substantially co-planar. In other words, the difference in ball height at the free end of the balls will be within a standard specification for co-planarity. The method accommodates warpage that results from the attachment of the die to the ball grid array package. The solution is inexpensive and easily implemented. The result is a ball grid array device that presents a co-planar surface and has good connectivity to other components in different applications.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A ball grid array device comprising:
    a substrate further including:
        a first major surface;
        a second, nonplanar major surface;
    a die attached to the first major surface of the substrate;
    a first ball having an attached end and a distal tip end, the attached end of the first ball attached to the second major surface, the first ball having a first height;
    a second ball having an attached end and a distal tip end, the attached end of the second ball attached to the second major surface, the second ball having a second height different than the first height.

2. The ball grid array device of claim 1 wherein the first height and the second height are selected so that the distal tip of the first ball and the distal tip of the second ball terminate on a plane.

3. The ball grid array device of claim 1 wherein the first major surface is nonplanar.

4. The ball grid array device of claim 1 further including a plurality of balls attached to the second major surface of the substrate, the height of the balls of the ball grid array package varied the distal tip ends of the plurality of balls terminate in a plane, the plane including the distal end of the first ball and the distal end of the second ball.

5. A method for forming the balls of a ball grid array device, the balls formed on a nonplanar major surface of a substrate, the method comprising:
    determining height differences across the major surface of the substrate;
    placing lands on the substrate; and
    forming a plurality of balls on the lands, each of the plurality of balls having an attached portion and a distal tip portion, the balls being formed with varying heights so the distal tip portion of each of the plurality of balls terminates at a substantially planar surface.

6. The method of claim 5 wherein determining the height differences across the nonplanar major surface of the substrate includes measuring the height differences between various locations on the nonplanar major surface.

7. The method of claim 5 wherein determining the height differences across the major surface of the substrate includes predicting the height differences between various locations on the nonplanar major surface.

8. The method of claim 5 wherein determining the height differences across the major surface of the substrate includes forming a topographical map of the nonplanar, major surface.

9. The method of claim 5 wherein forming a plurality of balls on the lands with varying heights further comprises placing a solder mask over the lands, the solder mask having openings therein of various diameters.

10. The method of claim 9 wherein the openings in the solder mask are substantially circular.

11. The method of claim 5 wherein forming a plurality of balls on the lands with varying heights further comprises placing a solder mask over the lands to vary the heights of the solder balls attached to the lands.

12. The method of claim 9 wherein each of the plurality of balls has substantially the same volume of material.

13. The method of claim 9 wherein forming a plurality of balls on the lands includes having at least some of the plurality of balls have a different volume of solder material than at least some of the other of the plurality of balls.

14. The method of claim 9 wherein forming a plurality of balls on the lands includes varying the volume of solder material that comprises the balls.

15. The method of claim 5 wherein forming a plurality of balls on the lands includes controlling the amount of surface area to which the solder material can attach.

16. The method of claim 5 wherein forming a plurality of balls on the lands includes controlling the amount of surface area to which the solder material can attach by placing a solder mask over the major surface of the substrate and varying the size of the openings over the lands.

17. A method for forming a ball grid array device comprising:
attaching a die to a first major surface of a substrate;
forming a plurality of lands on a second, nonplanar major surface of the substrate;
determining an amount of nonplanarity on the second major surface of the substrate;
attaching a plurality of balls to the lands on the second, nonplanar major surface of the substrate, the plurality of balls having different heights from the lands to which the balls are attached to accommodate the warpage on the second major surface of the substrate, each of the plurality of balls having distal ends that terminate on a plane.

18. The method of claim 17 wherein the balls each have an attached end and a distal end, wherein the distal ends of the balls terminate on a substantially planar surface.

19. The method of claim 17 wherein the volume of material forming the plurality of balls attached to the lands is substantially equal for each of the plurality of balls.

20. The method of claim 17 wherein attaching the plurality of balls includes forming a mask on the second major surface of the substrate, the mask having openings therein which correspond to the lands, the openings being smaller to form balls having a greater height and the openings being larger to form balls having a lesser height.

21. The method of claim 20 wherein the openings in the mask are substantially circular.

22. The method of claim 20 wherein the openings in the mask are substantially frusto-conically shaped.

23. The method of claim 17 wherein the balls of varying height are formed by varying the volume of solder used to form at least some of the balls.

24. The method of claim 17 wherein attaching the plurality of balls to the lands on the second, nonplanar major surface of the substrate includes determining the location of the land and the height of the ball to be attached to the land, so that the distal end of the ball is substantially co-planar with the distal ends of the other of the plurality of balls.

25. The method of claim 24 wherein attaching the plurality of balls includes forming a mask on the second, nonplanar major surface of the substrate, the mask having openings therein which correspond to the lands, the size of the openings in the mask restricting the amount of area of the land to which the ball attaches, the size of the openings related to the height of each of the plurality of the balls.

26. The method of claim 17 wherein attaching the plurality of balls includes forming a mask on the second, nonplanar major surface of the substrate, the mask having openings therein which correspond to the lands, wherein the size of the opening in the mask is varied to vary the height of the balls.

27. A ball grid array device comprising:
a substrate further including:
a first major surface;
a second nonplanar, major surface;
a die attached to the first major surface of the substrate;
a first ball having an attached end and a distal tip end, the first ball attached to the second major surface, the first ball having a first height;
a second ball having an attached end and a distal tip end, the second ball attached to the second major surface, the second ball having a second height;
a third ball having an attached end and a distal tip end, the third ball attached to the second major surface, the third ball having a third height;
a fourth ball having an attached end and a distal tip end, the fourth ball attached to the second major surface, the fourth ball having a fourth height, wherein at least one of the first height, second height, third height and fourth height differs from the others and wherein the distal ends of the first ball, the second ball, the third ball and the fourth ball terminate on a plane.

28. The ball grid array device of claim 27 wherein at least one of the attached ends of the first ball, the second ball, the third ball and the fourth ball has a different diameter than the remaining of the first ball, second ball, third ball and the fourth ball.

29. The ball grid array device of claim 27 wherein each of the first ball, the second ball, the third ball and the fourth ball has substantially the same volume of material.

30. The ball grid array device of claim 27 wherein at least one of the first ball, the second ball, the third ball and the fourth ball has a different volume of material from the remaining of the first ball, the second ball, the third ball and the fourth ball.

* * * * *

UNITED STATES PATENT AND TRADEMARK OFFICE
CERTIFICATE OF CORRECTION

PATENT NO. : 6,750,549 B1
DATED : June 15, 2004
INVENTOR(S) : Chandran et al.

It is certified that error appears in the above-identified patent and that said Letters Patent is hereby corrected as shown below:

Title page,
Item [57], ABSTRACT,
Line 13, after "major" insert -- surface --.

Column 10,
Line 4, delete "height" and insert -- heights --, therefor.

Signed and Sealed this

Twenty-fourth Day of May, 2005

JON W. DUDAS
*Director of the United States Patent and Trademark Office*